(12) United States Patent
Dabral et al.

(10) Patent No.: US 6,722,950 B1
(45) Date of Patent: Apr. 20, 2004

(54) METHOD AND APPARATUS FOR ELECTRODIALYTIC CHEMICAL MECHANICAL POLISHING AND DEPOSITION

(75) Inventors: Sanjay Dabral, Palo Alto, CA (US); Anil K. Pant, Santa Clara, CA (US)

(73) Assignee: Planar Labs Corporation, Sunnyvale, CA (US)

( * ) Notice: Subject to any disclaimer, the term of this patent is extended or adjusted under 35 U.S.C. 154(b) by 153 days.

(21) Appl. No.: 09/993,807

(22) Filed: Nov. 6, 2001

Related U.S. Application Data

(60) Provisional application No. 60/246,364, filed on Nov. 7, 2000, provisional application No. 60/246,352, filed on Nov. 7, 2000, and provisional application No. 60/246,351, filed on Nov. 7, 2000.

(51) Int. Cl.[7] .............................. B24B 1/00; B24B 7/00
(52) U.S. Cl. .............................. 451/36; 451/41; 451/54; 451/59; 451/285; 451/287; 451/288; 451/526; 451/550; 451/908
(58) Field of Search ..................... 216/88, 89; 438/690, 438/692, 693; 451/36, 41, 54, 59, 63, 285, 286, 287, 288, 289, 290, 526, 550, 905, 908

(56) References Cited

U.S. PATENT DOCUMENTS

| | | | |
|---|---|---|---|
| 4,692,223 A | * | 9/1987 | Lampert et al. ............... 205/83 |
| 4,839,005 A | | 6/1989 | Katsumoto et al. |
| 4,927,432 A | | 5/1990 | Bidomger et al. |
| 5,205,082 A | | 4/1993 | Shendon et al. |
| 5,329,732 A | | 7/1994 | Karlsrud et al. |
| 5,443,416 A | | 8/1995 | Voladarsky et al. |
| 5,453,312 A | | 9/1995 | Haas et al. |
| 5,558,568 A | | 9/1996 | Talieh et al. |
| 5,575,706 A | * | 11/1996 | Tsai et al. ..................... 438/693 |
| 5,578,362 A | | 11/1996 | Reinhardt et al. |
| 5,624,300 A | * | 4/1997 | Kishii et al. ................... 451/36 |
| 5,692,947 A | | 12/1997 | Talieh et al. |
| 5,735,729 A | | 4/1998 | Kobayashi et al. |
| 5,762,536 A | | 6/1998 | Pant et al. |
| 5,800,248 A | | 9/1998 | Pant et al. |
| 5,807,165 A | | 9/1998 | Uzoh et al. |
| 5,871,390 A | | 2/1999 | Pant et al. |
| 5,911,619 A | | 6/1999 | Uzoh et al. |
| 5,916,012 A | | 6/1999 | Pant et al. |
| 5,968,333 A | | 10/1999 | Nogami et al. |
| 6,004,880 A | | 12/1999 | Liu et al. |
| 6,066,603 A | | 5/2000 | Emert et al. |
| 6,090,239 A | | 7/2000 | Liu et al. |
| 6,132,289 A | | 10/2000 | Labunsky et al. |
| 6,186,865 B1 | | 2/2001 | Thornton et al. |
| 6,224,461 B1 | | 5/2001 | Boehm, Jr. et al. |
| 6,299,741 B1 | | 10/2001 | Sun et al. |
| 6,309,969 B1 | | 10/2001 | Oskam et al. |
| 6,368,190 B1 | * | 4/2002 | Easter et al. ................... 451/41 |
| 6,464,855 B1 | * | 10/2002 | Chadda et al. ................ 205/662 |
| 6,582,281 B2 | * | 6/2003 | Doan et al. .................... 451/41 |
| 2002/0025760 A1 | * | 2/2002 | Lee et al. ...................... 451/36 |
| 2002/0077035 A1 | * | 6/2002 | Wang et al. ................... 451/41 |

FOREIGN PATENT DOCUMENTS

WO    WO 01/71068 A1    9/2001

* cited by examiner

*Primary Examiner*—Timothy V. Eley
(74) *Attorney, Agent, or Firm*—Blakely Sokoloff Taylor & Zafman LLP

(57) ABSTRACT

Embodiments of the invention include methods and apparatus for electrodialytic polishing of various layers formed on semiconductor substrates. In certain embodiments the use of electrodialytic processes in conjunction with chemical mechanical forces to achieve a copper interconnect with a desired level of planarity and process performance. In certain embodiments electrodialytic polishing uses an electrodialytic polish pad, which is an active pad which has copper binding groups provided in its core structure and has an added capability of allowing electrical conductivity. An electrodialytic polish pad allows transfer of cations or anions through a membrane in the presence of an electric field and into a cathodic electrolyte. Under the influence of an electric field the electrodialytic polish pad and/or electrodialytic pads are continuously refreshed to bind cations.

20 Claims, 5 Drawing Sheets

METHOD AND APPARATUS FOR ELECTRODIALYTIC CHEMICAL MECHANICAL POLISHING AND DEPOSITION

This application claims the benefit of priority from U.S. Provisional Patent Application Serial No. 60/246,364 entitled "Method of Fabricating a Polishing Pad That Uses Ion Exchange Resin" filed on Nov. 7, 2000; U.S. Provisional Patent Application Serial No. 60/246,352 entitled "Method and Apparatus for Conditioning and Recharging Ion Exchange Resin Based Pads Used for Polishing and Cleaning Applications" filed on Nov. 7, 2000; and U.S. Provisional Patent Application Serial No. 60/246,351 entitled "Method and Apparatus for Electrodynamic Chemical Mechanical Polishing and Deposition" filed on Nov. 7, 2000.

FIELD OF THE INVENTION

Embodiments of the invention relate to polishing of various layers formed on a semiconductor substrates. More particularly, embodiments of the invention relate to electrodialytic polishing of copper layers formed on semiconductor substrates.

BACKGROUND OF THE INVENTION

Integrated circuits are typically formed on substrates (for example silicon wafers) by the formation of various conductive, semiconductive and/or insulative layers. Although a layer may be etched after deposition to form a planarized surface, planarity may be improved with other techniques. Chemical mechanical polishing (CMP) is one accepted method of planarization, which tends to achieve improved planarity over an etch-back technique. CMP typically requires the substrate or wafer be mounted on a carrier or polishing head, with the surface of the layer to be polished exposed. The wafer is then placed against a moving (mechanical) polishing pad. The carrier head may rotate, as well as provide other motion between the wafer and the polishing surface. A polishing slurry, typically including an abrasive and at least one chemically reactive agent, may be introduced onto the polishing pad surface to provide the chemical component of CMP to polish the exposed surface.

When CMP is used on certain materials, such as a deposited copper layer of a semiconductor device, several problems may arise. First, copper generally has to be oxidized before a chemical slurry removes it. Second, dishing and erosion problems may occur between the abrasive particles in the slurry and copper, such as interconnects or lines on the wafer. To minimize dishing and erosion of a copper layer, polish pads have been manufactured with abrasive particles incorporated into the pad. However, these pads tend to introduce higher defects during polishing because the abrasives are fixed and, therefore, the friction is not a rolling friction. Pads with incorporated abrasive particles also may need special indexing mechanism and tooling to be implemented. Additionally, a continuous pad surface typically may be desirable because the abrasive is usually spent after a first pass. Another problem with using a chemical slurry in copper CMP is that a copper containing waste stream may be generated and may present an environmental hazard that may require special handling.

In applying conventional planarization techniques, such as CMP, it is extremely difficult to achieve a high degree of surface uniformity. This may be particularly so across a surface having a dense array of features. For example, copper lines bordered by an open field. A dense array of metal features is typically formed in an interlayer dielectric, such as silicon oxide layer, by a damascene technique wherein trenches are initially formed. A barrier layer, such as a Ta-containing layer (e.g. Ta, TaN) is then deposited lining the trenches and on the upper surface of the silicon oxide interlayer dielectric. Copper or a copper alloy is then deposited, as by electroplating, electroless plating, physical vapor deposition (PVD), or chemical vapor deposition (CVD). In planarizing the wafer surface after copper metallization using CMP, undesirable erosion and dishing typically occur, decreasing the degree of surface uniformity or planarity and challenging the depth of focus limitations of conventional photolithographic techniques, particular with respect to achieving submicron dimensions. Erosion is defined as the height differential between the oxide in the open field and the height of the oxide within the dense array. Dishing is defined as a difference in height between the oxide and Cu within the dense array.

Dishing and erosion formation are more important parameters in evaluating metal CMP processes. There are generally two causes for dishing formation: a) insufficient planarization and b) over-polish. CMP accomplishes planarization, but the efficiency of the planarization decreases significantly as the feature size increases on the substrate. Over-polish is performed to remove metal residue from a wafer's surface after CMP. Over-polish contributes significantly to dishing and erosion formation, especially when over-polish is done at a relatively high polish rate in order to have high throughput. Past efforts to improve dishing and erosion included modifications to the slurry, polishing pad and the process. It remains desirable to have a process of planarization where dishing and erosion are decreased.

DETAILED DESCRIPTION OF THE INVENTION

Embodiments of the invention include the use of electrodialytic processes in conjunction with chemical mechanical forces to achieve a copper interconnect with a desired level of planarity and process performance. In certain embodiments, an appropriate combination of an electrodialytic polish pad of the present invention, oxidizing or reducing chemicals, electrolyte and electrodes, may be used for electrodialytic CMP and/or electrodialytic deposition of various materials including, but not limited to Copper, Tungsten, Aluminum, Tantalum, Tantalum Nitride, Titanium, Titanium Nitride, Titanium Silicide, Cobalt, Cobalt Silicide, Platinum, Platinum Silicide, Silicon, Polysilicon, Silicon Dioxide.

Electrodialysis is a process that allows transport of ions across a membrane in the presence of an electric field.

Unlike the polish pads used in electropolishing and electrodeposition based CMP processes, the electrodialytic polish pad of the present invention, which is used in electrodialytic polishing, is an active pad which has copper binding groups provided in its core structure and has an added capability of allowing electrical conductivity. An electrodialytic polish pad of the present invention allows transfer of cations or anions through a membrane in the presence of an electric field, thus under the influence of an electric field the electrodialytic polish pad and/or electrodialytic pads are continuously refreshed to bind cations. The electrodialytic polish pad that allows transport of cations only, is called a cation-exchange pad, and for anions only, it is called an anion-exchange pad. A bipolar pad allows the transport of both cations and anions.

Electrodialytic polishing requires the removal of copper over a dielectric followed by removal of a thin barrier material, such as Tantalum Nitride, TaN. Copper is left within inlaid structures, such as vias and interconnect lines. During polishing of the barrier material, it is desired that no more additional copper be removed from open vias or interconnect lines, thus a high selectivity in barrier material removal rate with respect to copper may be desired, in which barrier material is removed at a higher rate, which may be achieved with embodiments of the present invention. Barrier materials are removed at a higher rate by using an electrodialytic pad having a binding agent that is chelating in nature and will complex preferably with the barrier metal compared to copper. In alternative embodiments, copper may be preferentially removed by using an appropriate binding agent that preferentially binds copper within the electrodialytic pad.

Electrodialytic Polishing

Figure 1:
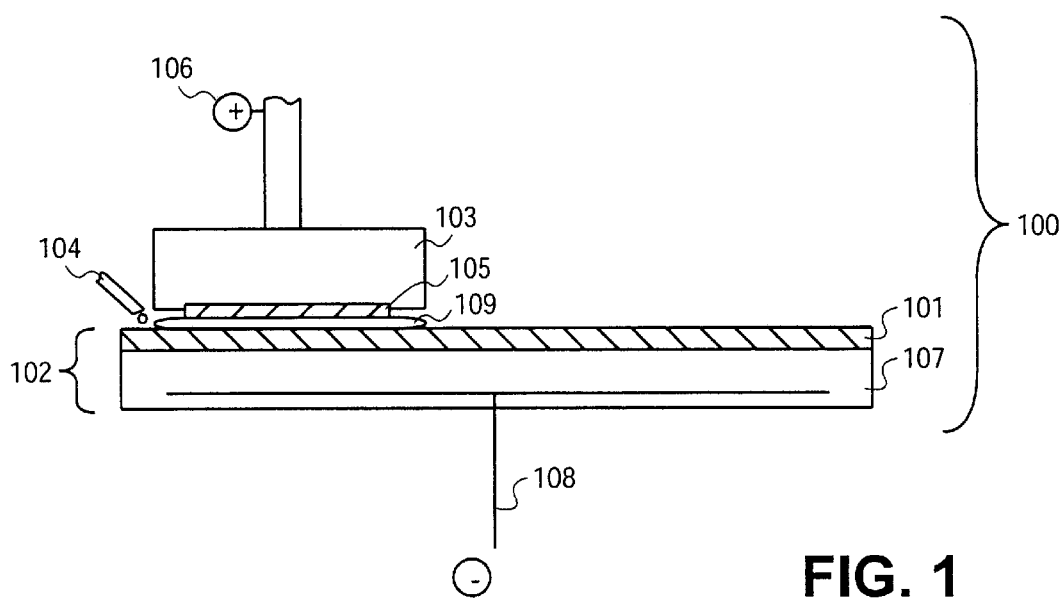
FIG. 1 illustrates an exemplary embodiment of electrodialytic polishing.

FIG. 1 depicts a schematic of an exemplary apparatus for electrodialytic polishing. The electrodialytic apparatus 100 of the present invention comprises an electrodialytic polish pad 101, a polishing platform 102, a polishing head 103, and a slurry delivery device 104. A semiconductor substrate 105 with a copper interconnect pattern is coupled to the polishing head 103, which is capable of translating, rotating, oscillating, or a combination of such motions. The polishing head 103 is operatively coupled to an anode 106.

In FIG. 1, the electrodialytic polish pad 101, which allows for an electrodialytic process to occur, is coupled to the polishing platform 102, which contains a conducting electrolyte 107. The conducting electrolyte 107 contacts the cathode 108 and the electrodialytic polish pad 101, which allows an electric current to pass from the anode 106 to cathode 108 through the electrodialytic polish pad 101, a slurry 109, the semiconductor substrate 105, and the polishing head 103. Note that in this configuration an anode and a cathode are on opposite sides of the electrodialytic polish pad 101.

The electrodialytic polish pad 101 forms a semipermeable barrier between the semiconductor substrate 105 and the conducting electrolyte 107. During the electrodialytic polishing process oxidizing chemicals are introduced by application of a slurry 109 between the semiconductor substrate 105 and the electrodialytic polish pad 101. The electrodialytic polish pad 101 binds ions, which are in turn driven from the membrane of the electrodialytic polish pad 101 by an electric field through the electrolyte 107 to the cathode 108.

Figure 2:
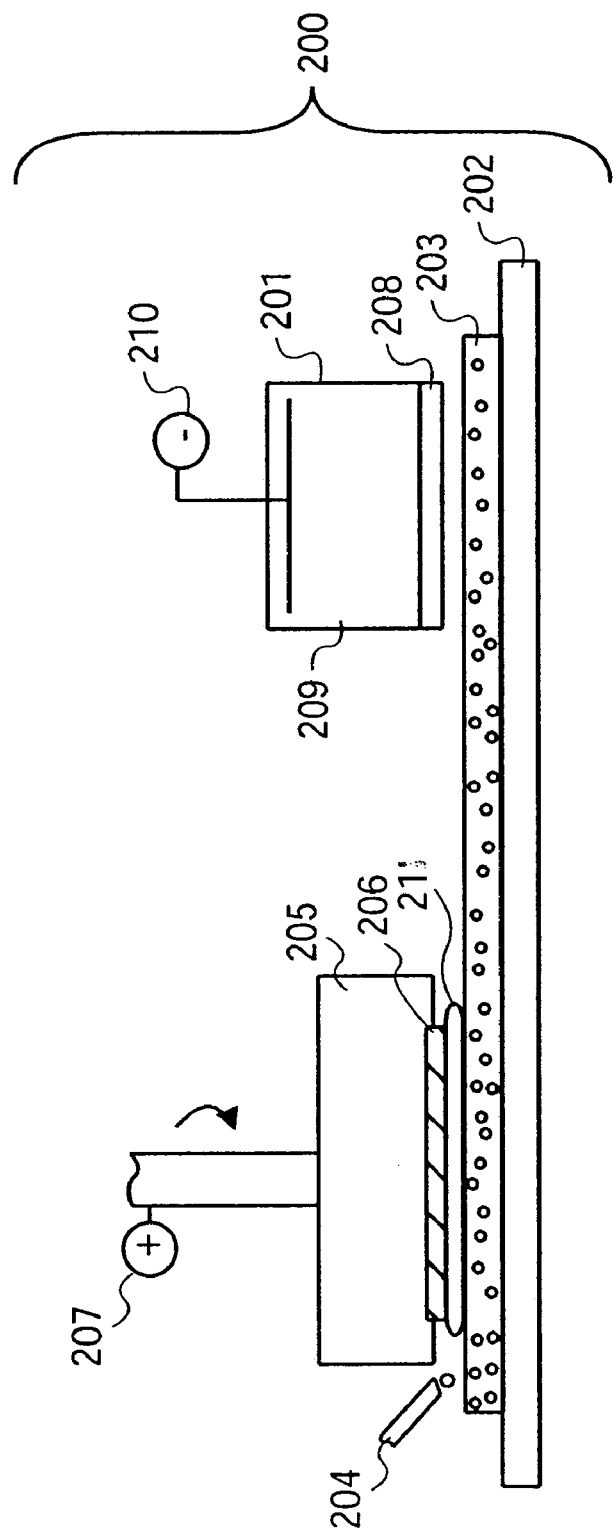
FIG. 2 illustrates an alternative exemplary embodiment of electrodialytic polishing.

FIG. 2 is a schematic of an alternative embodiment for an electrodialytic polishing apparatus of the present invention. The electrodialytic apparatus 200 comprises a cathode chamber 201, a polishing platform 202 coupled to an electrodialytic polish pad 203, a slurry delivery device 204, and a polishing head 205. A semiconductor substrate 206 is coupled to the polishing head 205 and is brought into contact with the electrodialytic polish pad 203, which allows the lateral movement of ions to the cathode chamber 201. The polishing head 205 is operatively coupled to an anode 207, which may be positioned on the same side of the electrodialytic polish pad 203 as the cathode chamber 201. The cathode chamber 201 comprises a electrodialytic pad 208 and a conducting electrolyte 209. The conducting electrolyte 209 contacts the cathode 210 and the electrodialytic pad 208. Transport of ions may occur laterally across the electrodialytic polish pad 203 to the electrodialytic pad 208.

The semiconductor substrate 206 is coupled to the polishing head 205, maintained at a positive potential, and pressed against the electrodialytic polish pad 203 under a desired pressure. An oxidizing chemical is applied to a surface of the electrodialytic polish pad 203 in the form of a slurry 211 via a slurry delivery device 204. The slurry 211 also provides an electrolyte that completes an electrical path for the electrodialytic action.

In certain embodiments, the methods include (a) oxidizing copper with a suitable oxidizing agent and passivating a copper oxide film formed across a layer on a semiconductor substrate and on features including high and low regions of an interconnect pattern, and (b) bringing a passivated copper oxide semiconductor substrate surface into contact with a cation-exchange pad where binding groups, such as a sulfonic acid groups, present in a cation-exchange pad bind copper from regions coated with a passivated copper oxide film. The bound copper may be driven from a membrane by an electric field through an electrolyte operatively coupled to a cathode. Under the influence of an electric field the membrane is continuously refreshed to bind a newly oxidized copper surface.

Removal of a thin film and reduction of the processed semiconductor substrate topography occurs as the semiconductor substrate 105 or 206 is rotated under pressure against a moving electrodialytic pad 101 or 203. A chemical slurry 109 or 211 including an oxidizing agent such as Ferric Nitrate, Potassium Permanganate, or the like may be applied between the layer(s) on a semiconductor substrate 105 or 206 and a electrodialytic pad 101 or 203. An electric field is established across the semiconductor substrate 105 or 206 to be polished and is held at a positive potential. In certain embodiments, hydrogen peroxide ($H_2O_2$) or water ($H_2O$) may be used to form a passivating film over copper at an anode. Chemical slurries of oxidizing agents may include, but are not limited to Ferric Nitrate, Potassium Permanganate and appropriate additional chemicals for pH balance, conductivity modifiers, and complexing agents that may be optimize to enhance the performance of the system.

Figure 3:
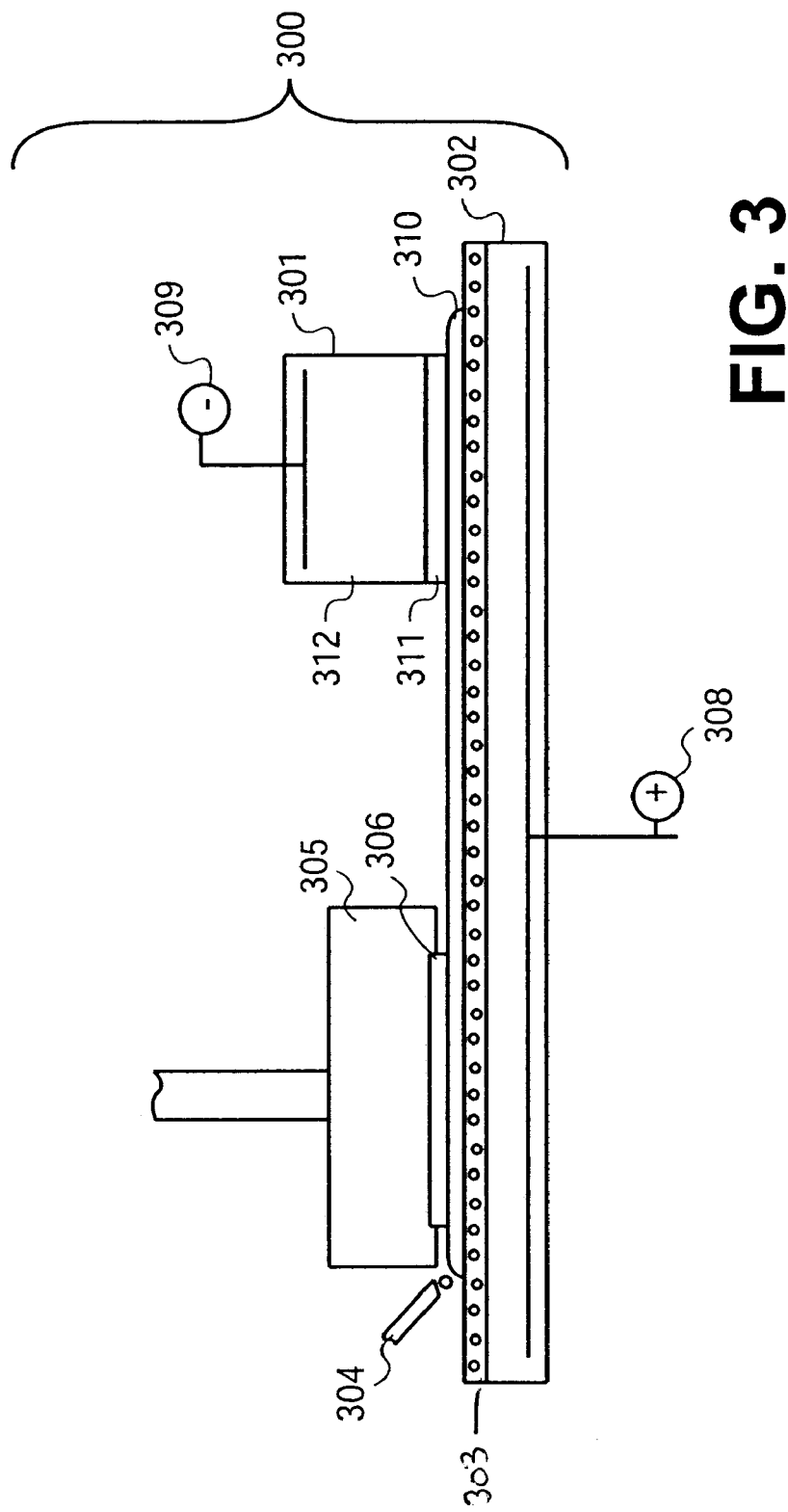
FIG. 3 illustrates yet another embodiment of electrodialytic polishing.

An alternative embodiment in illustrated in FIG. 3. The electrodialytic apparatus 300 comprises a cathode chamber 301, a polishing platform 302 coupled to an electrodialytic polish pad 303, a slurry delivery device 304, and a polishing head 305. A semiconductor substrate 306 is coupled to the polishing head 305 and is brought into contact with the electrodialytic polish pad 303, which allows the lateral movement of ions to the cathode chamber 301. The polishing head 305 is positioned on the same side of the electrodialytic polish pad 303 as the cathode chamber 301. The polishing platform contains a conducting electrolyte 307. The conducting electrolyte 307 contacts an anode 308 and the electrodialytic polish pad 303, thus allowing an electric current to pass from the anode 308 to cathode 309 through the electrodialytic polish pad 303, a slurry 310, and the cathode chamber 301. In this particular embodiment ions may be driven from the electrodialytic polish pad 303 to the cathode chamber 301 without an electric field being applied across the semiconductor substrate 306.

In FIG. 3 the cathode chamber 301 comprises an electrodialytic pad 311 and a conducting electrolyte 312. The conducting electrolyte 312 contacts the cathode 309 and the electrodialytic pad 311. The general components and interactions of the components are as described earlier. In the exemplary embodiment illustrated in FIG. 3 the electric field is applied across the electrodialytic polish pad 303 and the cathode chamber 301, instead of applying the electric field across a semiconductor substrate and a cathode. Alternatively, a semiconductor substrate may be polished with no electric field present.

In another embodiment, a combination of processes exemplified in FIG. 1 and FIG. 3 is used such that a bulk of the copper is removed when an electric field between a semiconductor substrate and a cathode followed by performing a final polish with an electric field across an electrodialytic polish pad and a cathode.

Electrodialytic Pad

Figure 4:
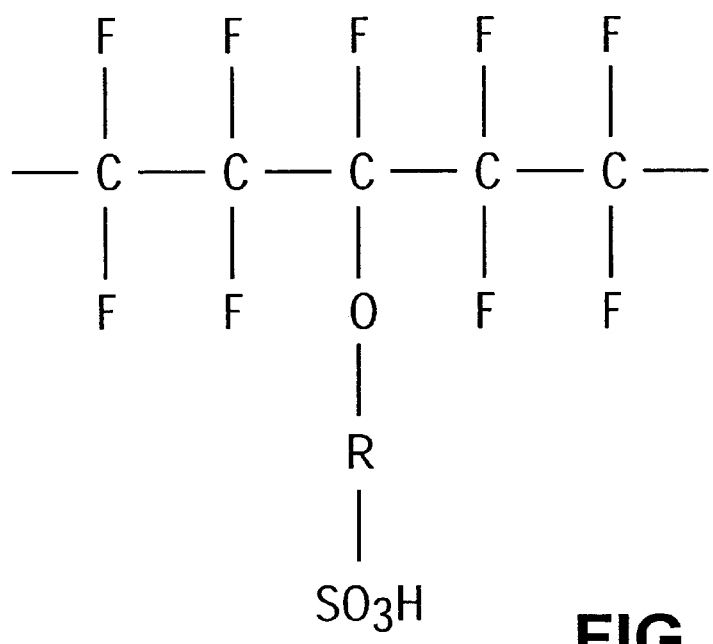
FIG. 4 illustrates an example of a polymer containing sulfonic acid groups.

In certain embodiments, the electrodialytic pad is a cation-exchange pad that is used for polishing copper or other metals. An example of a cation-exchange pad is a commercially available Nafion™ NE-424 ion exchange membrane from DuPont. It is a perfluorinated ion exchange polymer and is fabricated from copolymers of tetrafluoroethylene and perfluorinated monomers containing sulfonic acid groups, an example of which is illustrated in FIG. 4. The membrane may be permeable to cations and polar compounds but almost completely rejects anions and non-polar species. The cation is transferred through the membrane under the influence of a driving force such as an electric field, concentration gradient, and/or hydrostatic pressure.

An electrodialytic pad with suitable properties such as hardness, compressibility, specific gravity, resilience, permeability, porosity, electrical conductivity, and appropriate binding agents may be developed to optimize the performance of the system.

Additional Embodiments

The current methods of electropolishing of copper in combination with chemical mechanical polishing as well as electrodeposition of copper in combination with chemical mechanical polishing are used as alternatives to conventional CMP processes, but are still not ideal. Both these processes use electrode potential to drive an electronic transfer reaction. The electronic transfer reaction may be used to remove or deposit copper or other metals and simultaneously using CMP to achieve planarization of a surface layer formed on a semiconductor substrate. However, pure electrode potential driven electron transfer processes are inherently prone to poor planarization.

One problem encountered with electropolishing based CMP is that such processes need electrical contacts on a copper interconnect film present on the front side of the wafer. These electrical contacts are made on the periphery of semiconductor substrate. As the copper is polished around an edge, current densities increase drastically around the edge as compared to the center. If the copper is completely removed at certain points around the edges, the electrical continuity to the center of the wafer is broken. As a result certain portions of the wafer will have residual copper that cannot be removed. Electrodialytic polishing of the present invention can be operated without electrical contact to a copper layer formed on a semiconductor substrate, thus it avoids the problem encountered with electropolishing based CMP. The edge to center non-uniformity of removal/deposition on a semiconductor substrate may also be addressed by optimizing the geometrical design of a cathode. For example, removal or deposition rate may be increased or decreased from center to edge by making a cathode convex or concave, respectively.

Figure 5:
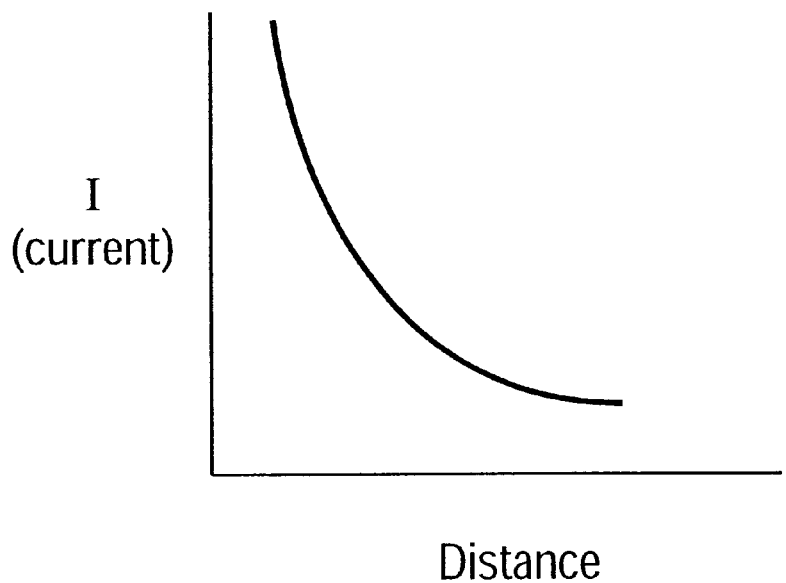
FIG. 5 illustrates an exponential relationship of current to distance.

Electrodialytic polishing using an electrodialytic pad may also exploit the phenomenon of tunneling current. In tunneling mode, the current is related exponentially to the distance, FIG. 5. This property may be used to enhance removal from asperities with respect to valleys. To use the tunneling property, an electrodialytic pad is typically in intimate contact with a Cu surface and has an extremely smooth surface. Areas farther away from an electrodialytic pad may have poor current flow and the removal rate may be reduced. This feature may provide a high selectivity between high and low lying areas. Processes that do not use an electrodialytic pad generally need a certain roughness to the polishing surface of a pad. The use of tunneling current would be difficult with a rough surface, which would translate into difficulties achieving a planar semiconductor substrate surface with low dishing values.

In yet another embodiment, electrode polarity may be reversed such that a processed semiconductor substrate coupled to a polishing head may be at a negative potential. The method includes coating a wafer with a thin film of copper seed layer, replacing an oxidizing chemical as described above with an appropriate electrolyte/plating solution, and replacing the electrolyte in a polishing platform and a cathode chamber with appropriate electrolyte/plating solution. This particular embodiment may be used to deposit planarized copper films on a cathode. In certain embodiments a semiconductor substrate may be held at cathodic potential.

Alternatively, a method is contemplated that is capable of plating copper on a first semiconductor substrate held at a cathode potential while simultaneously planarizing a second semiconductor substrate held at an anode potential. By using an appropriate electrolyte, such as a copper sulfate solution, and using semiconductor substrates, such as a first semiconductor substrate patterned for copper interconnect as an anode and a second semiconductor substrate having a copper seed layer as a cathode, copper may be electrodeposited on to a semiconductor substrate at a cathode potential at the same time that copper is polished away from a semiconductor substrate at an anode potential. Thus, Copper being removed from a first semiconductor substrate may be deposited onto a second semiconductor substrate. This may drastically reduce copper waste while at the same time providing a cost-effective method for processing semiconductor substrates. End users may have an option of depositing and polishing on two separate wafers at the same time.

Figure 6A:
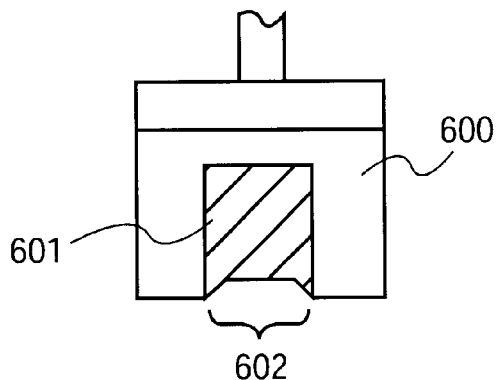
FIGS. 6A and 6B illustrate a cross-sectional view of an example of repairing dishing in a copper interconnect.
Figure 6B:
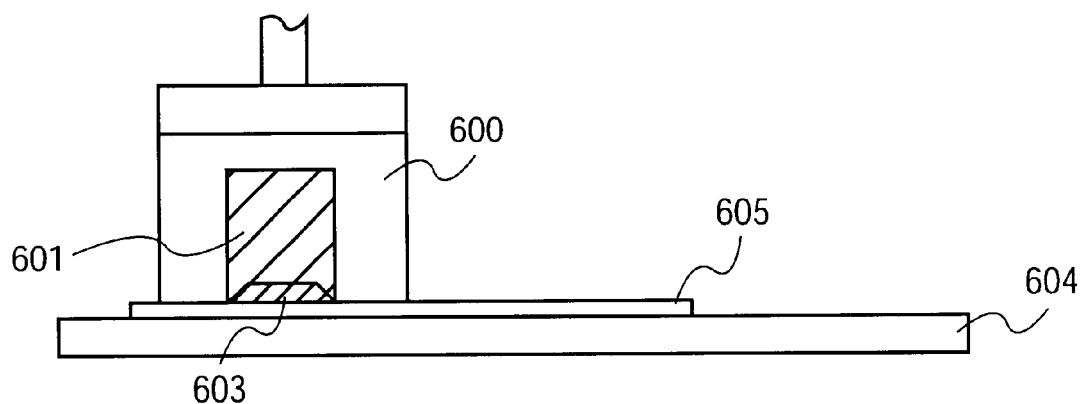

In still another embodiment, a polish pad is used in combination with an appropriate electroless plating solution to repair material with dishing 602 as shown in FIG. 6. Illustrated in FIG. 6A is a cross-sectional view of a processed semiconductor substrate 600 with a copper interconnect 601 demonstrating dishing 602 after polishing. FIG. 6B illustrates a similar cross-sectional view after dishing is repaired by exposure to an electroless plating solution 605. Shown in FIG. 6B is a semiconductor substrate 600 with a copper interconnect 601 with a repaired region 603, which is typically indistinguishable form the copper interconnect 601. Also shown is a polish pad 604 with an electroless plating solution 605 between the polish pad 604 and the processed semiconductor substrate 600.

We claim:

1. A method, comprising polishing a wafer with an electrodialytic polishing pad in the presence of an electric field created by applying an electric potential to an anode, a cathode, one of which is electrically connected to the electrodialytic polishing pad.

2. The method of claim 1, further comprising introducing a slurry between the wafer and the electrodialytic polishing pad during the polishing.

3. The method of claim 2, wherein the slurry comprises an oxidizing agent.

4. The method of claim 1, wherein the electrodialytic polishing pad comprises a cation-exchange pad.

5. The method of claim 1, wherein the electrodialytic polishing pad comprises an anion-exchange pad.

6. The method of claim 1, wherein the electrodialytic polishing pad comprises a bipolar pad.

7. The method of claim 1, wherein the electrodialytic polishing pad is electrically connected to the anode, the wafer is held at cathodic potential and the polishing is performed with an electrolyte/plating solution introduced between the wafer and the electrodialytic polishing pad.

8. An electrodialytic polishing apparatus, comprising:
a polishing head;
a polishing platform coupled to an electrodialytic polishing pad; and
a cathode chamber coupled to the electrodialytic polishing pad.

9. The apparatus of claim 8, wherein the polishing head is coupled to an anode.

10. The apparatus of claim 8, wherein the cathode chamber contains an electrolyte.

11. A system, comprising:
an anode and a cathode, one of which is electrically connected to an electrodialytic polishing pad such that when an electric potential is applied to the anode and the cathode, an electric field between the anode, the cathode and the electrodialytic polishing pad will be created; and
a platform configured to support a wafer proximate the electrodialytic polishing pad during wafer polishing operations.

12. The system of claim 11, further comprising means for introducing a slurry between the wafer and the electrodialytic polishing pad during the polishing operations.

13. The system of claim 12, wherein the electrodialytic polishing pad comprises a cation-exchange pad.

14. The system of claim 12, wherein the electrodialytic polishing pad comprises an anion-exchange pad.

15. The system of claim 12, wherein the electrodialytic polishing pad comprises a bipolar pad.

16. The system of claim 12, further comprising means for introducing an electrolyte/plating solution introduced the wafer and the electrodialytic polishing pad during the polishing operations.

17. The system of claim 12, wherein the platform comprises a polishing head configured for translation, rotation, oscillation, or a combination of such motions during the polishing operations.

18. The system of claim 17, the cathode and the anode are disposed on opposite sides of the electrodialytic polishing pad with respect to one another.

19. The system of claim 17, wherein the cathode and the anode are disposed on a same side of the electrodialytic polishing pad with respect to one another.

20. The system of claim 12, the cathode and the anode are disposed on opposite sides of the electrodialytic polishing pad with respect to one another.

* * * * *